United States Patent
Badaroglu et al.

(10) Patent No.: US 10,157,992 B2
(45) Date of Patent: Dec. 18, 2018

(54) NANOWIRE DEVICE WITH REDUCED PARASITICS

(71) Applicant: QUALCOMM Incorporated, San Diego, CA (US)

(72) Inventors: Mustafa Badaroglu, Leuven (BE); Vladimir Machkaoutsan, Wezemaal (BE); Stanley Seungchul Song, San Diego, CA (US); Jeffrey Junhao Xu, San Diego, CA (US); Matthew Michael Nowak, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/980,850

(22) Filed: Dec. 28, 2015

(65) Prior Publication Data

US 2017/0186846 A1     Jun. 29, 2017

(51) Int. Cl.
*H01L 29/423*     (2006.01)
*H01L 21/02*     (2006.01)
(Continued)

(52) U.S. Cl.
CPC ........ *H01L 29/42392* (2013.01); *B82Y 10/00* (2013.01); *H01L 21/02507* (2013.01); *H01L 21/02532* (2013.01); *H01L 21/762* (2013.01); *H01L 29/0653* (2013.01); *H01L 29/0673* (2013.01); *H01L 29/086* (2013.01); *H01L 29/0878* (2013.01); *H01L 29/165* (2013.01); *H01L 29/4966* (2013.01);
(Continued)

(58) Field of Classification Search
CPC ........... H01L 29/42392; H01L 29/0676; H01L 29/165; H01L 29/4966; H01L 29/66545; H01L 29/66795; H01L 29/66439; H01L 29/66484; H01L 29/66553; H01L 29/66575; H01L 29/401; H01L 29/775; H01L 29/7831; H01L 29/0653; H01L 29/0673; H01L 29/4236; H01L 21/762; H01L 21/02507; H01L 21/02532; H01L 21/0245; H01L 21/0337
See application file for complete search history.

(56) References Cited

U.S. PATENT DOCUMENTS 7,700,446 B2     4/2010 Anderson et al.
8,748,940 B1     6/2014 Rachmady et al.
(Continued)

FOREIGN PATENT DOCUMENTS

WO     WO-2013101230 A1     7/2013
WO     WO-2014004033 A1     1/2014
WO     WO-2014051728 A2     4/2014

OTHER PUBLICATIONS

International Search Report and Written Opinion—PCT/US2016/059219—ISA/EPO—dated Feb. 6, 2017.

*Primary Examiner* — Brigitte A Paterson
(74) *Attorney, Agent, or Firm* — Haynes and Boone, LLP (36340)

(57) ABSTRACT

A nanowire transistor is provided that includes a well implant having a local isolation region for insulating a replacement metal gate from a parasitic channel. In addition, the nanowire transistor includes oxidized caps in the extension regions that inhibit parasitic gate-to-source and gate-to-drain capacitances.

7 Claims, 6 Drawing Sheets

(51) Int. Cl.
  *H01L 21/762* (2006.01)
  *H01L 29/06* (2006.01)
  *H01L 29/165* (2006.01)
  *H01L 29/49* (2006.01)
  *H01L 29/66* (2006.01)
  *H01L 29/775* (2006.01)
  *H01L 29/78* (2006.01)
  *B82Y 10/00* (2011.01)
  *H01L 29/08* (2006.01)

(52) U.S. Cl.
  CPC .. *H01L 29/66439* (2013.01); *H01L 29/66484* (2013.01); *H01L 29/66545* (2013.01); *H01L 29/66795* (2013.01); *H01L 29/775* (2013.01); *H01L 29/7831* (2013.01)

(56) References Cited

U.S. PATENT DOCUMENTS

| | | |
|---|---|---|
| 8,753,942 B2 | 6/2014 | Kuhn et al. |
| 8,785,981 B1 | 7/2014 | Chang et al. |
| 8,927,966 B2 | 1/2015 | Liu et al. |
| 2005/0112851 A1 | 5/2005 | Lee et al. |
| 2014/0183452 A1 | 7/2014 | Hirai et al. |
| 2014/0264280 A1* | 9/2014 | Kim ................ H01L 29/785 257/29 |
| 2015/0035071 A1* | 2/2015 | Ching ............... H01L 27/092 257/369 |
| 2015/0102287 A1 | 4/2015 | Wang et al. |
| 2015/0372115 A1 | 12/2015 | Koh et al. |
| 2016/0027929 A1* | 1/2016 | Cheng ............. H01L 29/78696 257/9 |

\* cited by examiner

NANOWIRE DEVICE WITH REDUCED PARASITICS

TECHNICAL FIELD

This application relates to transistor devices, and more particularly to nanowire devices with reduced parasitic capacitance and channel effects.

BACKGROUND

At advanced process nodes, conventional planar transistor architectures suffer from a number of problems such as excessive leakage. As a result, three-dimensional architectures such as a fin field effect transistor (finFET) process are conventionally used at these advanced nodes. The "fin" in a finFET device comprises a three-dimensional bar on the semiconductor substrate. The fin thus has a lower surface adjoining the substrate surface and three remaining surfaces that project above the substrate surface. The gate is then deposited over the fin such that the gate is directly adjacent these three remaining surfaces of the fin. In contrast, the gate is directly adjacent only one surface of the channel in a conventional planar architecture. The channel can thus be cut off more effectively in a finFET device, which reduces leakage currents and makes the advanced process nodes tenable.

Although finFETs are thus advantageous, the gate cannot directly control the fin surface that adjoins the substrate surface. To provide even better gate control, gate-all-around architectures have been developed in which the fin is transformed into one or more nanowires suspended from the substrate surface. Gate-all-around devices may thus also be denoted as nanowire devices or transistors. To start the formation of a nanowire transistor, a well implant is formed in the semiconductor substrate. Then, the foundry deposits alternating layers of Si and SiGe over the well implant. These alternating layers are then etched to form a fin. The foundry then deposits shallow trench isolation oxide fill around the fins followed by a dummy gate formation. After the dummy gate formation, the foundry performs an extension implant, spacer deposition, source/drain epitaxial (epi) growth, junction implant, inter-layer dielectric (ILD0) fill, whereupon the dummy gate is removed. With the dummy gate removed, the nanowires may then be formed by either selectively etching the Si layers in the fin or selectively etching the SiGe layers. If SiGe layers are removed, the resulting nanowires are silicon. Conversely, if the silicon layers are selectively etched, the nanowires are SiGe. The gate structure may then be deposited around the nanowires.

Despite the resulting nanowire device having better gate control than a comparable finFET device, the selective etching of silicon germanium (or silicon) layers through the window between the spacers prior to the gate deposition produces an undercut beneath the spacers. Given the undercutting of the SiGe or Si layers, the subsequent gate-to-source and gate-to-drain parasitic capacitance is relatively high. In addition, the bottom parasitic channel in the well implant below the gate is not controlled well since there is no gate-all-around contact for this bottom parasitic channel. It will thus conduct an undesirable leakage current. In addition, there is an undesirable parasitic capacitance between the gate and the bottom parasitic channel.

There is thus a need in the art for improved nanowire device architectures with reduced parasitic capacitance and reduced parasitic channel effects.

SUMMARY

To provide improved reduction of parasitic capacitances in a nanowire device, a local isolation region is formed in a well implant that inhibits formation of a parasitic channel when a replacement metal gate is charged. In addition, extension regions in the nanowire device are implanted with an etch stop dopant that inhibits selective etching of first semiconductor layers in the extension regions. The etch stop dopant also makes the first semiconductor layers in the extension regions vulnerable to a selective oxidation that forms oxidized caps to insulate the replacement metal gate from the drain and source regions.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

To avoid the undercutting during the selective etching of the nanowires, an extension implant is disclosed that makes the extension regions resistant to the selective etching through the implantation of an etch stop dopant. The same extension implant of the etch stop dopant renders the extension regions susceptible to a selective oxidation prior to the formation of the replacement metal gate. The resulting gate-to-source and gate-to-drain parasitic capacitances are thus relatively low due to the lower k of the oxide layer as well as the reduced undercut that spaces the gate from the source/drain regions. In addition, a local isolation region may be formed in the well implant through an oxygen implantation prior to the deposition of the epitaxial layers in the fin so as to provide a reduced parasitic capacitance between the replacement metal gate and any parasitic channel formed in the well implant.

Figure 1A:
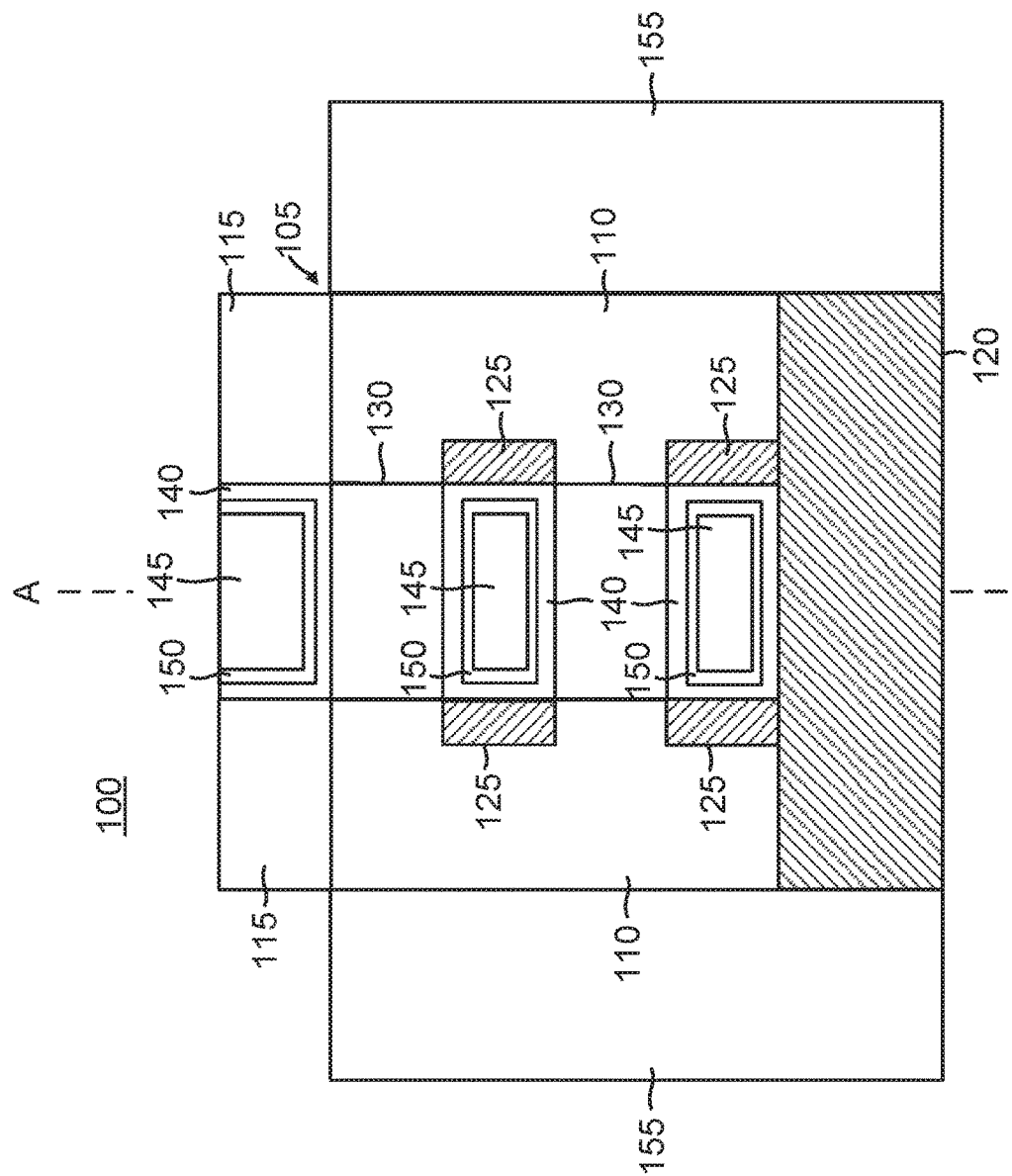
FIG. 1A illustrates a longitudinal cross-section of a nanowire transistor in accordance with an aspect of the disclosure.

An example nanowire transistor 100 is shown in a cross-sectional view along a longitudinal axis of a fin 105 in FIG. 1A. Fin 105 comprises alternating first semiconductor layers and second semiconductor layers as will be discussed further herein. For example, the first semiconductor layers may comprise silicon (Si) layers and the second semiconductor layers may comprise silicon germanium (SiGe) layers. Depending upon whether the first or second semiconductor layers are selectively etched during the manufacture of nanowire transistor 100, nanowires 130 may result from either the first or second semiconductor layers. The selective etching process selectively etches only the first semiconductor layers or the second semiconductor layers to form nanowires 130. As used herein, the semiconductor layers that are selectively etched will be also be referred to as the selectively-etched semiconductor layers whereas the remaining semiconductor layers will be denoted herein as the nanowire layers. For example, in a Si nanowire embodiment, the silicon layers would be the nanowire layers whereas the SiGe layers would be the selectively-etched layers. Conversely, in a SiGe nanowire embodiment, the SiGe layers would be the nanowire layers whereas the Si layers would be the selectively-etched layers.

A replacement metal gate including a metal gate fill 145 surrounds nanowires 130 and is separated from nanowires 130 by an inner work function layer 150 and an outer high-k dielectric layer 140. High-k dielectric layer 140 thus contacts nanowires 130 while work function layer 150 separates metal gate fill 145 from high-k dielectric layer 140. Fin 105 extends longitudinally in the same direction as nanowires 130. In contrast, the replacement metal gate comprising metal gate fill 145, work function layer 150, and high-k dielectric layer 140 extends laterally across fin 105 at right angles to the longitudinal axis defined by nanowires 130. With regard to this lateral extension of the replacement metal gate across fin 105, the replacement metal gate is positioned between a pair of spacer layers 115 deposited above fin 105. Extension regions 110 lie directly beneath spacer layers 115 at either end of nanowires 130 and a corresponding drain/source region 155. Extension regions 110 are thus situated between nanowires 130 and drain/source regions 155. As will be discussed further herein, extension regions 110 are implanted with an etch stop dopant so as to be resistant to the selective etch that forms at least one nanowire 130. The selectively-etched semiconductor layers are thus made resistant to the selective etch that forms nanowires 130 in the channel portion of nanowire transistor 100. For example, in a Si nanowire embodiment, the SiGe layers (discussed further below) are the selectively-etched semiconductor layers. Such a selective etch will also tend to etch the SiGe layers within extension regions 110. But the etch stop dopant implanted into extension regions 110 inhibits the selective etching of the SiGe layers in extension regions 110 in a silicon nanowire embodiment.

The inhibition of the selective etch within extension regions 110 results in the replacement metal gate not extending into extension regions 110 but instead limited to a channel region between extension regions 110. This is quite advantageous with regard to reducing undesirable gate-to-source and gate-to-drain parasitic capacitances in nanowire transistor 100. As will be explained further, metal gate fill 145 as well as its corresponding inner and outer layers 150 and 140 are deposited into a dummy gate opening defined by spacers 115. To further reduce these parasitic capacitances, extension regions 110 are oxidized through the dummy gate opening to form oxidized caps 125 in the selectively-etched semiconductor layers prior to the deposition of the replacement metal gate. Metal gate fill 145 and its inner and outer layers 150 and 140 are then eventually deposited through the dummy gate opening such that oxidized caps 125 are positioned between both longitudinal ends of nanowires 130 and the remainder of extension regions 110. Thus, not only is metal gate fill 145 prevented from extending into extension regions 110, it is also insulated from extension regions 110 by oxidized caps 125 so as to further reduce any resulting gate-to-source and gate-to-drain parasitic capacitances.

Figure 1B:
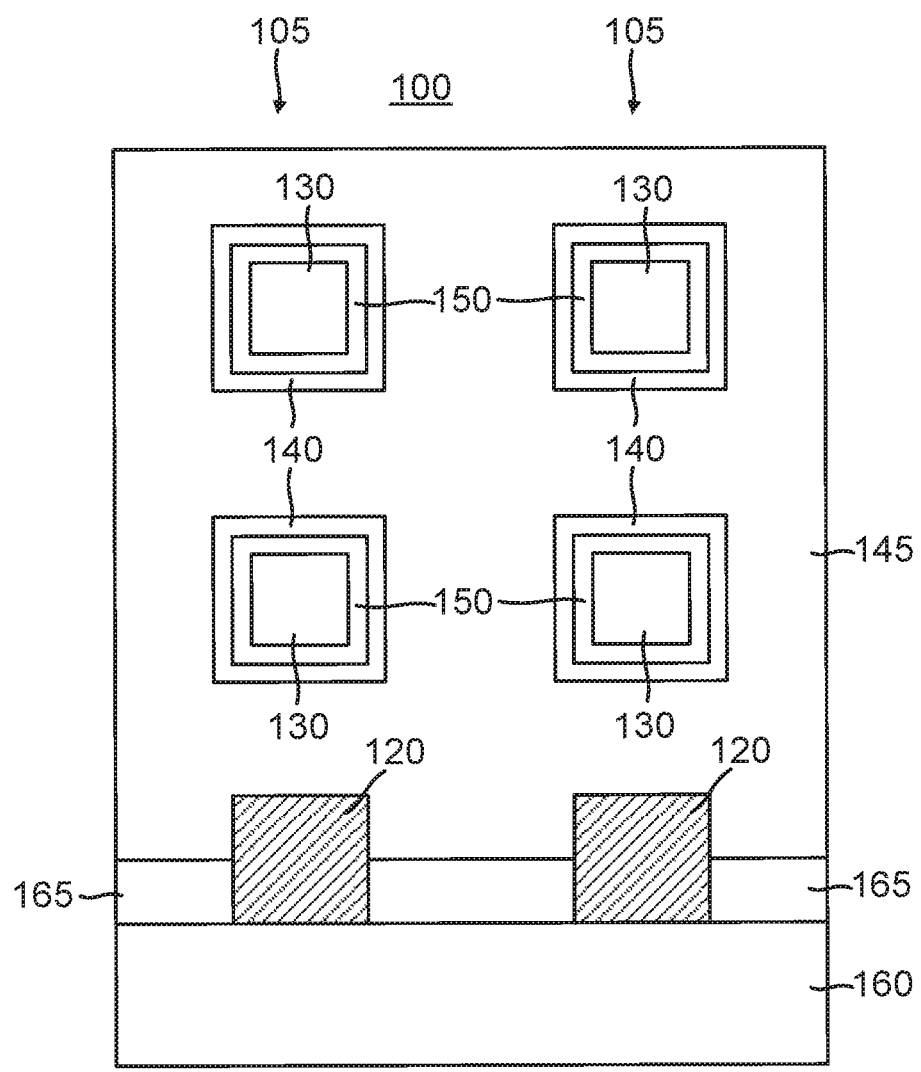
FIG. 1B is a lateral cross-section of the nanowire transistor of FIG. 1A taken along dotted line A:A.

Nanowire transistor 100 is shown in cross-sectional view in FIG. 1B taken along dotted line A:A. Nanowires 130 are completely surrounded by metal gate fill 145 so that the resulting channel formed in each nanowire 130 may be better controlled as compared to planar and finFET approaches. In nanowire transistor 100, there are two fins 105 so that there are actually four nanowires 130. It will be appreciated that fewer or greater numbers of nanowires 130 may be implemented in alternate embodiments. Fins 105 are formed on a substrate 160. Fins 105 are formed from a deposition of the first and second semiconductor layers on a well implant. Prior to this deposition, an oxygen implantation in the well implant forms a unitary local isolation region. The deposited layers are then etched to form fins 105. This same etching forms local isolation regions 120 from the unitary local isolation region previously formed in the well implant. Shallow trench isolation (STI) oxide regions 165 may insulate fins 105. Local isolation regions 120 are quite advantageous as they insulate the replacement metal gate from the well implant to reduce any undesirable parasitic capacitance that would otherwise form between the replacement metal gate and the well implant. These advantageous features may be better appreciated with regard to the following example method of manufacture.

Method of Manufacture

Figure 2:
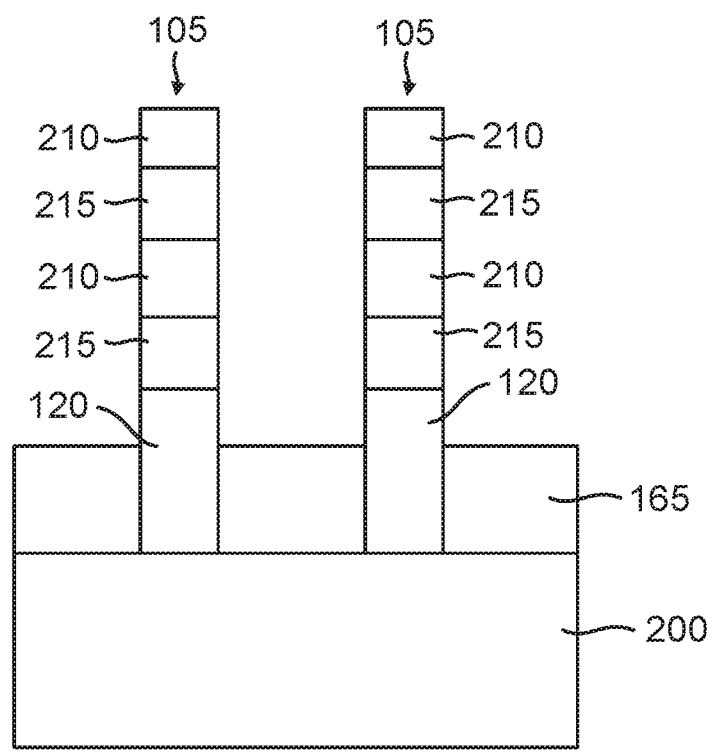
FIG. 2 is a lateral cross section of a pair of fins prior to the selective etching process.

To begin the manufacture, a suitable substrate such as a silicon or a silicon on insulator (SOI) substrate receives a well implant 200 as shown in FIG. 2. An oxygen implantation may then be performed such as through a separation by implanted oxygen (SiMOX) process to form a unitary local isolation region that will eventually be patterned into local isolation regions 120. Selectively-etched semiconductor layers 215 are then deposited so as to alternate with nanowire semiconductor layers 210. The following discussion will assume that nanowire semiconductor layers 210 are Si layers and that selectively-etched semiconductor layers 215 are SiGe layers. In one embodiment, layers 210 and 215 may be epitaxially deposited. Layers 210 and 215 may also be doped p-type or n-type depending upon whether the resulting nanowire transistor is to be a p-channel metal oxide (PMOS) device or an n-channel (NMOS) device. A shallow trench isolation (STI) process may then be performed on layers 210 and 215 to form fins 105 and STI regions 165. For example, fins 105 may be either wet or dry etched from layers 210 and 215.

Figure 3:
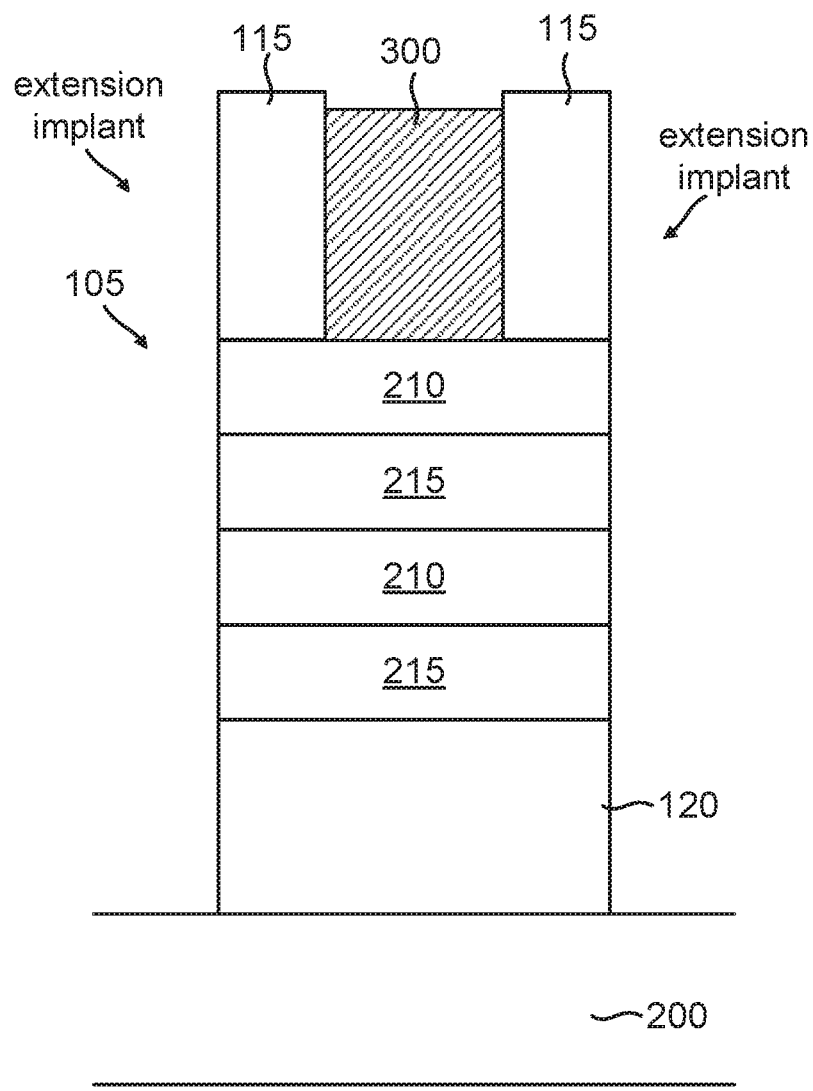
FIG. 3 is a longitudinal cross-section of one of the fins in FIG. 2 after formation of the dummy gate, spacers, and extension regions.

As shown in FIG. 3, a dummy gate 330 of, for example, oxide material may then be deposited laterally across each fin 105 followed by an angled extension implant to each side of dummy gate 330 to form extension regions 110. This extension implant also includes the etch stop dopant for the selectively-etched layers 215. For example, carbon may be used as the etch stop dopant for an embodiment in which selectively-etched layers 215 comprise SiGe layers. The extension implant would also implant the etch stop dopant into nanowire layers 210 in extension regions 110 but these layers are already resistant to the selective etch process that will eventually be used to form the nanowires so that such doping is innocuous. Spacers 115 may then be deposited on either side of dummy gate 330. Spacers 115 may comprise a suitable material such as silicon nitride.

Figure 4:
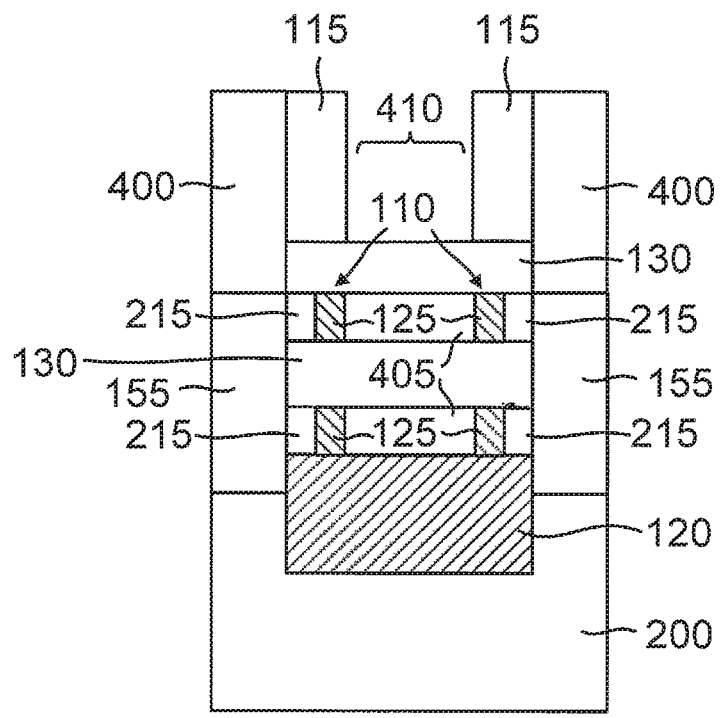
FIG. 4 is a longitudinal cross section of the fin of FIG. 3 after the selective etching process and formation of the oxidized caps in the extension region.
Figure 5:
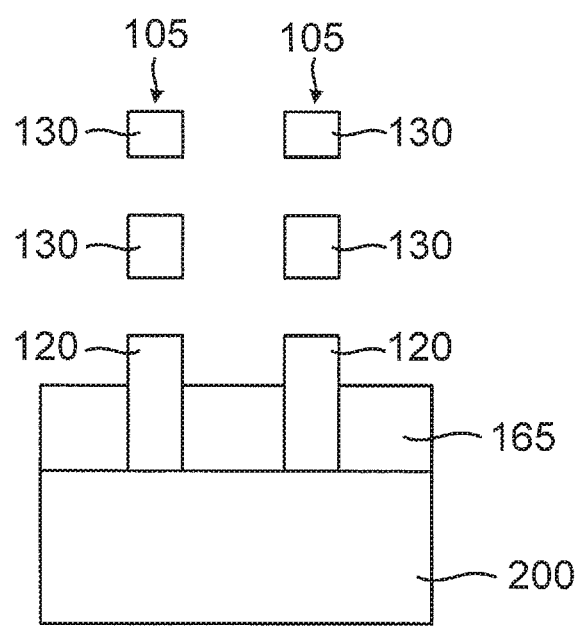
FIG. 5 is a lateral cross-section of the fins of FIG. 2 after the selective etching process.

Referring now to FIG. 4, source/drain regions 155 may be epitaxially deposited on extension regions 110 followed by a junction implant for the source/drain regions 155. An inter-layer dielectric (ILD) fill step forms ILD regions 400. After removal of the dummy gate, nanowires 130 may be selectively etched through a resulting dummy gate opening or window 410 between spacers 115. Selectively-etched semiconductor layers 215 are selectively etched through dummy gate opening 410 to form nanowires 130 from nanowire layers 210 (FIG. 3). For example, if selectively-etched semiconductor layers 215 comprise SiGe layers, an acidic wet etch such as HCL, carboxylic acid, HF, or nitric acid may be used. Alternatively, if selectively-etched semiconductor layers 215 are Si layers, a basic wet etch such as aqueous ammonium hydroxide or potassium hydroxide may be used. But the etch stop dopant implanted into extension regions 110 prevents the selectively-etched layers 215 in extension regions 110 from being etched by the selective etch process used to form nanowires 130. Selectively-etched layers 215 are thus only removed in areas 405 below dummy gate opening 410. After the selective etch process, oxidized caps 125 are formed by a selective oxidation through dummy gate opening 410. The etch stop dopant implanted into extension regions 110 makes the selectively-etched layers 215 in extension regions 110 susceptible to this selective oxidation. In contrast, nanowires 130 are resistant to this selective oxidation that forms oxidized caps 125. FIG. 5 is a lateral cross-sectional view across both fins 105 showing the isolation of nanowires 130 following the selective etching process.

Referring again to FIGS. 1A and 1B, a replacement metal gate process may begin with a high-k dielectric layer 140 being deposited through dummy gate opening 410 of FIG. 4. For example, high-k dielectric layer 140 may comprise a suitable material such as hafnium dioxide, zirconium dioxide, hafnium silicate, or zirconium silicate deposited through an atomic layer deposition process. Work function layer 150 is then deposited. Work function layer 150 may comprise titanium nitride, tantalum nitride, titanium aluminum, or other suitable materials. Finally, metal gate fill 145 is deposited. Metal gate fill 145 may comprise tungsten or aluminum. Like high-k dielectric layer 140, metal gate fill 145 and work function layer 150 may be deposited using a suitable process such as atomic level deposition or chemical vapor deposition.

Figure 6:
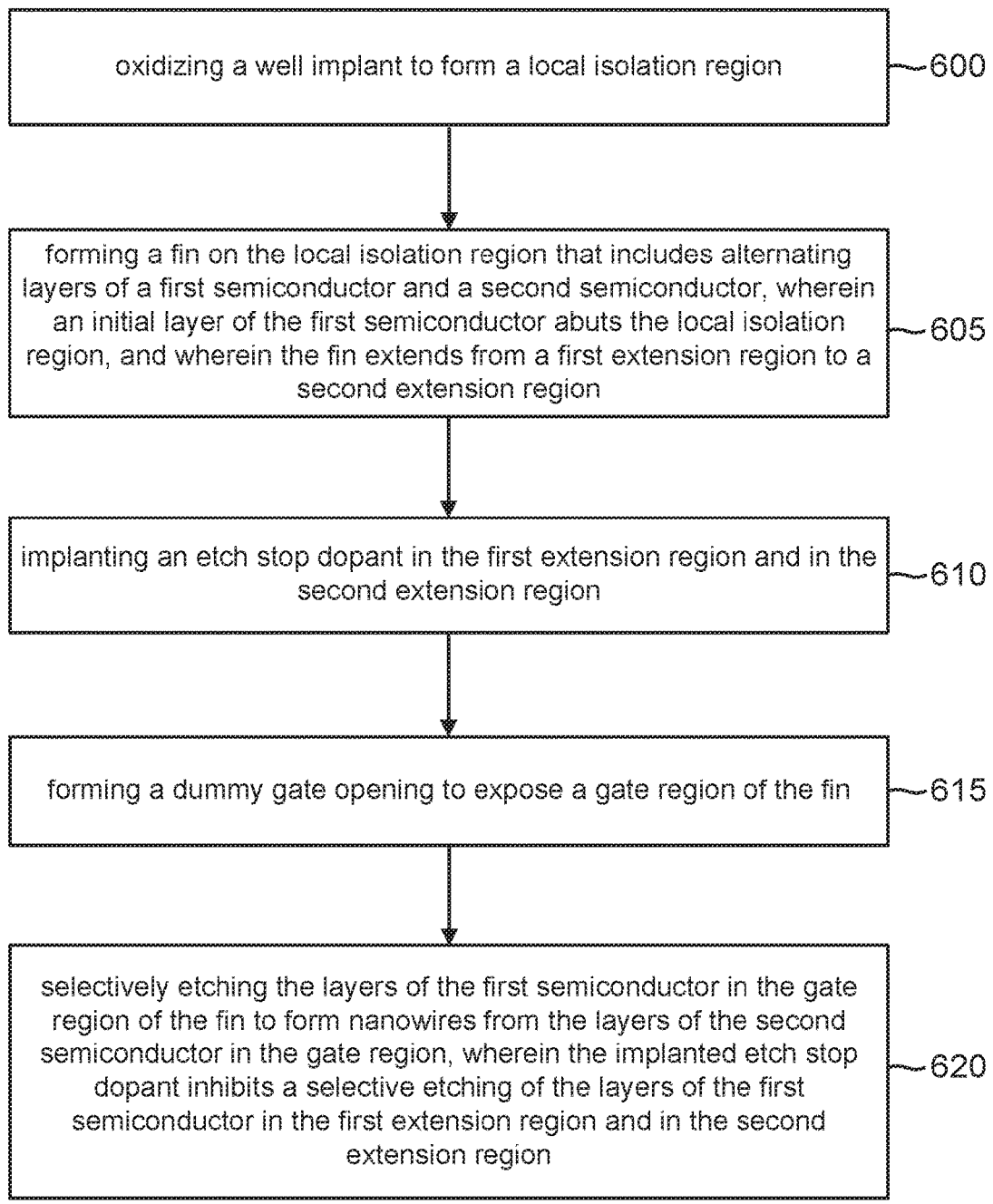
FIG. 6 is a flowchart for a method of manufacture in accordance with an aspect of the disclosure.

The method of manufacture may be summarized with regard to the flowchart shown in FIG. 6. The method includes an act 600 of oxidizing a well implant to form a local isolation region. The formation of local isolation region 120 in FIGS. 1A and 1B is an example of act 600. In addition, the method includes an act 605 of forming a fin on the local isolation region that includes alternating layers of a first semiconductor and a second semiconductor, wherein an initial layer of the first semiconductor abuts the local isolation region, and wherein the fin extends from a first extension region to a second extension region. The formation of fin 105 and its layers 210 and 215 in FIG. 3 is an example of act 605. In that regard, one of extension regions 110 in FIG. 1A may be deemed to be a first extension region whereas a remaining one of extension regions 110 may be deemed to be a second extension region.

Moreover, the method includes an act 610 of implanting an etch stop dopant in the first extension region and in the second extension region. The implantation of the etch stop dopant in the first and second extension regions is discussed with regard to FIG. 3. Finally, the method includes an act 615 of forming a dummy gate opening to expose a gate region of the fin as well as an act 620 of selectively etching the layers of the first semiconductor in the gate region of the fin to form nanowires from the layers of the second semiconductor in the gate region, wherein the implanted etch stop dopant inhibits a selective etching of the layers of the first semiconductor in the first extension region and in the second extension region The formation of dummy gate opening 410 and the selective etching of the layers of the first semiconductor is discussed with regard to FIG. 4.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A nanowire transistor, comprising:
    a nanowire extending from a first surface of a first extension region including a first semiconductor layer to a first surface of a second extension region including the first semiconductor layer, the first extension region and the second extension region each including a second semiconductor layer adjacent the first semiconductor layer;
    a first spacer on the first surface of the first extension region;
    a second spacer on the first surface of the second extension region; and
    a replacement metal gate surrounding the nanowire, wherein the second semiconductor layer in the first extension region includes a first oxidized cap ending at the first surface of the first extension region and extending into the first extension region and the second semiconductor layer in the second extension region includes a second oxidized cap ending at the first surface of the second extension region and extending into the second extension region.

2. The nanowire transistor of claim 1, further comprising:
    a substrate; and
    a well implant in the substrate adjacent the replacement metal gate, wherein the well implant includes an oxidized local isolation region positioned between a remainder of the well implant and the replacement metal gate.

3. The nanowire transistor of claim 1, wherein each second semiconductor layer comprises a silicon germanium layer including an etch stop dopant.

4. The nanowire transistor of claim 3, wherein the etch stop dopant comprises carbon.

5. The nanowire transistor of claim 1, wherein the replacement metal gate comprises:
    an outer high-k layer adjacent the at least one nanowire;
    a metal gate fill;
    and a work function layer between the outer high-k layer and the metal gate fill.

6. The nanowire transistor of claim 1, further comprising:
    a plurality of silicon nanowires, and wherein the second semiconductor layer in the first extension region and the second semiconductor layer in the second extension region each comprises a plurality of silicon germanium layers.

7. The nanowire transistor of claim 1, wherein each second semiconductor layer comprises a silicon layer including an etch stop dopant.

* * * * *